United States Patent
Honda et al.

(10) Patent No.: US 7,361,896 B2
(45) Date of Patent: Apr. 22, 2008

(54) SCANNING ELECTRON MICROSCOPE AND A METHOD FOR ADJUSTING A FOCAL POINT OF AN ELECTRON BEAM OF SAID SCANNING ELECTRON MICROSCOPE

(75) Inventors: Toshifumi Honda, Yokohama (JP); Munenori Fukunishi, Yokohama (JP); Kenji Obara, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 185 days.

(21) Appl. No.: 11/130,121

(22) Filed: May 17, 2005

(65) Prior Publication Data

US 2005/0258366 A1 Nov. 24, 2005

(30) Foreign Application Priority Data

May 18, 2004 (JP) ............................. 2004-147336

(51) Int. Cl.
*G01N 23/00* (2006.01)
(52) U.S. Cl. .............. 250/311; 250/306; 250/307; 250/310; 250/396 R; 250/399
(58) Field of Classification Search ........ 250/306–311, 250/396 R, 397–399, 491.1
See application file for complete search history.

(56) References Cited

U.S. PATENT DOCUMENTS 6,067,164 A * 5/2000 Onoguchi et al. .......... 356/401
6,333,510 B1 * 12/2001 Watanabe et al. ...... 250/559.27
6,838,667 B2 * 1/2005 Tsuneta et al. ............. 250/306
7,075,077 B2 * 7/2006 Okuda et al. ............... 250/310
2005/0184237 A1 * 8/2005 Takane et al. .............. 250/311

FOREIGN PATENT DOCUMENTS

| JP | 06-267481 | 9/1994 |
|----|-----------|--------|
| JP | 08-148109 | 6/1996 |
| JP | 11-183154 | 7/1999 |
| JP | 2000-310962 | 11/2000 |
| JP | 2002-244029 | 8/2002 |
| JP | 2002-310962 | 10/2002 |
| JP | 2002-334678 | 11/2002 |

OTHER PUBLICATIONS

Japanese Office Action, dated Oct. 30, 2007, issued in Japanese Patent Application No. 2004-147336.

* cited by examiner

*Primary Examiner*—Jack I. Berman
*Assistant Examiner*—Michael J Logie
(74) *Attorney, Agent, or Firm*—Antonelli, Terry, Stout & Kraus, LLP.

(57) ABSTRACT

In a scanning electron microscope, scanning region is set to be narrow, upon which focused electron beam is scanned, so that the focused electron beam can be irradiated at the almost same position by plural numbers of times, irrespective of movement of the stage or of moving of the stage during braking thereof, and upon that region to be scanned is irradiated the focused electron beam, by plural numbers of times, while changing the focal position, thereby forming an image thereof. From the image formed is calculated out a section, from which a focus-in position can be calculated out, and then the focus-in position is calculated out from that calculated section.

26 Claims, 5 Drawing Sheets

706
708
710

SCANNING ELECTRON MICROSCOPE AND A METHOD FOR ADJUSTING A FOCAL POINT OF AN ELECTRON BEAM OF SAID SCANNING ELECTRON MICROSCOPE

BACKGROUND OF THE INVENTION

The present invention relates to a scanning electron microscope and a method for adjusting a focal point of an electron beam of said scanning electron microscope, for picking up an image of view upon an observation target, such as, industrial products, in particular, a semiconductor on way of production in preprocessing of semiconductors, through detection of electrons discharged from irradiation position, upon which a focused electron beam is irradiated, and in particular, it relates to a technology for reducing or shortening a tact time for picking-up a SEM image, especially, with using a SEM-type semiconductor wafer inspection apparatus, being required to pickup an image at high magnifying power, with a review SEM apparatus, for use of observation about defects, which are detected on the semiconductor wafer, in much more details thereof, and further with a measuring SEM apparatus, for measuring a pattern formed on the semiconductor wafer, but requiring no time for executing an automatic focusing thereof.

Accompanying miniaturization of the semiconductors, it comes be difficult, more and more, to control the manufacturing processes in preprocessing of such the semiconductors, and in particular, it is also difficult to detect and/or observe the defects, and to measure a size of pattern width, with using an optical microscope; therefore, the inspection, the review and measurement are commonly conducted, upon basis of an image which is pickup by means of the SEM apparatuses. Since the picked-up image through the SEM apparatus has a characteristic, of being deep in the focal depth comparing to that of the optical one, therefore, conventionally, the necessity is low for an automatic focusing thereof at high accuracy, in particular, with an inspection apparatus and/or a review apparatus of such SEM-type. This is because, the image-pickup target can be entered within the focal depth of the SEM, easily, through applying a method of detecting the height of the wafer surface by means of an optical height detector, which is described in the following Patent Document 1, for example, and thereby to fit the focus of the SEM apparatus upon basis of that surface height detected, but without applying the automatic focus based on the image, which may be picked up by means of that SEM apparatus.

As a prior art disclosing such the method as was mentioned above, there is already known the following Patent Document 2. As the technology disclosed in this Patent Document 2, there is described a method of picking up an image while moving a stage, as a manner for achieving a high-speed review apparatus; however, in this prior art, in particular, in relation to a manner of automatic focusing, it is presumed that a sensor is used for achieving real-time detection in the height direction of a wafer, with respect to the movement of the stage. However, in a case when picking up the observation target at further high magnifying power, since also the focal depth comes to be shallow, further; therefore, there occurs a necessity of an automatic focusing upon the basis of the image, which is picked up by means of the SEM. As a manner for achieving such the automatic focusing upon the basis of the image picked up through the SEM, in particular, in such the case, there is already known a method, including the following steps of, for example: picking up images at various settings while changing the setting of an electron optic system, so that the focus position of the SEM differs in Z direction, directing the focused electron beam irradiated from the SEM into the Z direction; applying a high-pass filter upon those images for passing through only components having high space-frequencies; determining that the focus is most fitted at the setting where an image can be picked up, at which setting this output response comes to be the largest; and achieving the automatic focusing upon the basis of the settings of the electron optic system which takes that image.

Patent Document 1: Japanese Patent Laying-Open No. Hei 11-183154 (1999); and

Patent Document 2: Japanese Patent Laying-Open No. 2002-183154 (2002).

Thus, with such the conventional arts as was mentioned above, there is a problem that an image at high magnification or high magnifying power cannot be picked up within a short tact time. As was explained in the above, the focal depth becomes shallow, when picking up an image of high magnification by means of the SEM apparatus. At the time of the year 2004, it comes down to be 90 nm, in particular, in width between lines formed on the semiconductor, therefore, for the purpose of measuring the thickness of this line or wire at high accuracy, there is a necessity of picking up an image at the magnifying power of about 150,000 times, for example. At that magnification, the resolution of about 2 nm is required to the electron optic system, and for achieving such the resolution, in general, the focal depth comes down to be less than 1 μm. Because of such shallow focal depth, in this manner, it is difficult to detect the surface height in the real-time manner. Also, if it is possible to achieve the real-time measurement on the surface height of the wafer with an error less than 1 μm, however, in general, it is impossible to achieve the focusing at high accuracy upon the basis of such the measurement value.

This is since, with the SEM apparatus, the image is picked up by detecting secondary electrons and/or electrons reflected, which are discharged from the observation target while irradiating the focused electron beam upon that observation target; however, if the balance is broken between the secondary electron beams irradiating thereupon and the secondary electrons or the electrons reflected from that observation target, in particular, in an amount thereof, then the observation target being charged with electricity; therefore, change will be caused easily in the focus position, with receiving ill influences of the electric field upon the surface of the observation target, which is caused due to such the charge of electricity. In particular, among the recent wafers, many of them are covered on the surface thereof, with an insulation film, such as, silicon oxide, for example, and if the number of electrons discharged comes up to be larger than that of those electrons being incident thereon, and then the wafer surface is charged with electricity to be positive, but because the material itself is an insulation film; therefore, it is difficult to supply depleted electrons form other areas of the wafer; therefore the charge of electricity has a tendency of becoming large in an amount thereof. For this reason, it is difficult to pick up an image in focus, upon the basis of a result of detection of the surface height, in particular, the wafer that is covered with the insulating film thereon.

On the other hand, with the method of picking up the images in plural numbers thereof, while shifting the focus in the Z direction, wherein the high-pass filter is applied for passing through only the components having high space-frequency upon the images, respectively, and it is determined that the focus is most fitted at the setting point where the image can be picked up, at which setting point this output response comes to be the largest, thereby, achieving the automatic focusing upon the basis of the setting points of the electron optic system which takes that image; however, there is a necessity of picking up the images in plural numbers thereof under the condition where the observation target and the electron optic system stand still at the positions thereof, so that no change occurs on the position within a filed of view (or view field) of the observation target, and for this reason, it brings about the problem of taking a long time for the contact. In a case where scanning is made upon the focused electron beam at the same frequency of an electron gun of a TV, for example, and if assuming a regular square view field, it needs a time of 33 ms or more or less.

In general, the images obtained from the SEM apparatus are noisy in quality thereof, in many cases, and therefore, for the purpose of improving the S/N thereof, it is common to apply a method thereupon, which is generally called by "flame addition". With this method, through conducting the scanning of focused electron beam upon the view fields by plural numbers of times, so as to make up frames from the images obtained at this time, an averaged value is calculated out upon the plural numbers of frames of the same address, and this averaged value is reserved or stored as an image; thereby, reducing the noises down to $1/\sqrt{N}$ when assuming that the number of addition of the frames is N. Now, assuming that the number of addition of the frames is four (4) for achieving the automatic focus, and then it takes 132 ms for picking up one (1) piece of image. Herein, assuming that ten (10) pieces of images are picked up while shifting the focus position into the Z direction, thereby to make up the automatic focusing, it takes about 1.3 sec for picking up the image; therefore, it is impossible to achieve the image pickup within a short tact time.

SUMMARY OF THE INVENTION

Then, an object according to the present invention is to provide a scanning electron microscope and an automatic focusing method thereof, for picking up an image at high magnification (for example, at the magnifying power of around 150,000 times) for use of measurement, inspection and/or defect review upon a sample, such as, a semiconductor wafer, etc., while automatically controlling the focus thereof, upon basis of the pickup images obtained by the scanning electron microscope within a short tact time, thereby obtaining a high resolution, up to 2 nm or more or less, for example.

For dissolving such the problems of the conventional arts mentioned above, according to the present invention, there is provided a scanning electron microscope, in which a control variable of the focal position controller means is calculated out of the condition of focus-in, under the condition of moving the view field by means of a view field moving means, such as, a stage for controlling the view field of picking up an image in the SEM apparatus, for example.

Namely, according to the present invention, an adjustment or compensation is made upon the scanning position of focused electron beam while changing each of the focal positions, but without moving the stage for controlling the view field of picking up an image in the SEM apparatus, so as to make the focused electron beam upon the same position at a focus-in point, and thereby enabling an automatic focusing.

Thus, according to the present invention, there is provided a scanning electron microscope, having: a first electron beam irradiation controller means for adjusting or compensating scanning position of the focused electron beam through controlling a deflection means depending upon an amount of movement of the view field at each of the focal positions, while changing the focal position in a Z direction through controlling the focal position controller means, under the condition of moving the view field by means of the view field moving means, such as, the stage or the like, so as to irradiate said focused electron beam, which is adjusted or compensated on the scanning position thereof, at the focus-in point on the image-pickup target, thereby obtaining an intensity signal due to secondary electrons and reflected electron obtained from said focus-in point at each of said focal positions; and, an analyzing portion for calculating out a focus-in position through analyzing the intensity signal for use in calculation of the focus-in position at the each focal position, which is obtained from said first electron beam irradiation controller means, and further comprising a first focus-in position control variable calculation means for calculating out a control variable of said focal position controller means upon basis of the focus-in position calculated by said analyzing portion, wherein said focal position controller means is controlled upon basis of the control variable, which is calculated out by said first focus-in position control variable calculating means, so that an image is picked up of a predetermined region upon said image-pickup target by means of said electron optic system under the focus-in condition.

Also, according to the present invention, further there is provided a measurement means for measuring an amount of movement of the view field, which is moved by said first view field movement means, and wherein an adjustment or compensation is made upon the scanning portion of said focused electron beam through controlling said deflection means, depending upon the movement amount of the view field measured by said measurement means.

Also, according to the present invention, within said first electron beam irradiation means mentioned above, the focused electron beam, which is adjusted or compensated on the scanning potion thereof, is irradiated upon the focus-in point on said image-pickup target, while being scanned into plural numbers of directions.

Also, according to the present invention, within said first electron beam irradiation means mentioned above, a condition that said electron optic system moves the view field for picking up an image of said image-pickup target can be obtained by effecting brake upon said view field movement means.

Also, according to the present invention, within the analyzing portion, applying the band-pass filter upon the intensity signals for use in calculation of focus-in position at said each focal position, conducting sectioning upon an output profile of said band-pass filter, so as to divide it into arbitrary plural numbers thereof, specifying the section, in which the output profile is larger than a determining reference of determination, to be a section, from which the focus-in position control variable can be calculated out, among the plural numbers of sections divided, and analyzing the intensity signal for use in calculation of the focus-in position at the each focal position within that specified section, and then the focal position is calculated out.

Also, according to the present invention, the intensity signal (i.e., the profile signal) detected at the each focal position is overlapped one by one, covering over plural numbers of focal positions neighboring with each other, to be conducted the ling addition thereupon, so that an averaged intensity signal at the plural numbers of focal positions can be obtained; therefore, it is possible to reduce the number of times of line scanning the focused electron beam, and thereby enabling to bring an amount of movement of the view field within a region (for example, 30 μm), in which the scanning position of the focused electron beam can be adjusted or compensated.

Also, according to the present invention, in particular, when moving the stage under the step & repeat operation, the automatic focusing is achieved at the time of decelerating the stage movement, when the moving velocity of the stage is relatively low, so as to pick up an image of the image-pickup target when the stage stops, thereby enabling to pick up an image at high resolution.

Also, according to the present invention, the section is specified to be applicable for calculation of the focal position, upon basis of the signal waveform, which is taken when trying to achieve the automatic focusing, and in the case if no such section cannot be found out, the automatic focusing can be tried, again, after stopping the stage.

Thus, according to the present invention, it is possible to conduct the automatic focusing during the time when the stage is moving; therefore, it is possible to take an image of through the scanning electron microscope within a short tact time.

Those and other objects, features and advantages of the present invention will be apparent from the following more particular description of preferred embodiments of the invention, as illustrated in the accompanying drawings.

BRIEF DESCRIPTION OF THE SEVERAL VIEWS OF THE DRAWING

FIGS. 2(a) and 2(b) are views for explaining a target patter for use in focus controlling according to the present invention, and in particular, FIG. 2(a) shows a plane view of a sample having line-like repetitive patterns thereon, while

FIGS. 3(a) and 3(b) are views for explaining a scanning method of focused electron beam according to the present invention, and in particular, FIG. 3(a) shows a plane view of the sample having line-like repetitive patterns thereon, for explaining a method for scanning that sample with using the focused electron beam, while FIG. 3(b) shows a plane view of the sample having patterns, which are locally collated thereon, for explaining a method for scanning that sample with using the focused electron beam;

FIGS. 4(a) and 4(b) are views for showing sequences for picking up an image for use in an automatic focus according to the present invention, and in particular.

FIGS. 5(a) to 5(d) are views for explaining a method of calculating out a position of being in focus (i.e., the in-focus position), according to the present invention, and in particular.

FIGS. 6(a) and 6(b) are views for explaining about a section, on which the calculation can be made, in the method of calculating out the focus-in position according to the present invention, and in particular, FIGS. 7(a) to 7(c) are views for showing timing charts within an ADR, and in particular.

DESCRIPTION OF THE PREFERRED EMBODIMENTS

Upon the semiconductor wafer, patterns are formed through a large number of steps, into the multilayer structure. In the processes for building up such the multi-layer structure, for the purpose of monitoring the manufacturing process thereof, a measurement of sizes of a pattern, which is formed on each of the layers, and/or an inspection on an external appearance thereof, as well as, a review of defects which are detected through the visual inspection thereof.

In recent years, since advancement is made more and more, in particular, of miniaturization thereof, within the semiconductor processing, and for achieving this, the SEM apparatuses are applied into the process of picking up an image, which enable to pick up an image at the resolution higher than that obtained through the optic microscope. The SEM apparatus has the depth of focus equal or less than 1 μm in the case of picking up an image at the magnifying power about 150,000 times. Although an image is taken at the magnifying power lower than that, within the visual inspection apparatus of the SEM type, such as, several thousands times, for example, however the image pickup must be conducted at high speed, it is necessary to make an amount of current of the focused electron beam. Also in this time, for making the diameter of the focused electron beam small on the surface of an observation target, it is necessary to open an aperture of opening wide, and then the depth of focus comes to be relatively shallow, such as, several μm, for example.

Focusing of the SEM can be achieved through detecting the height on the wafer surface, so as to make an adjustment or compensation on the beam to be the smallest, in the diameter of the focused electrons; however, since the focal position can easily receive ill influence from the surface potential of the wafer, then the focus-in image cannot be obtained, always, even if measurement can be obtained on the height of the wafer surface. Then, assuming that the irradiating direction of the focused electron beam is Z, a method is widely applied, in which images are picked up in plural numbers thereof, differing from each other at the focal position thereof, into the Z direction, and the image is obtained from those, which is fitted in the focal position at the most, thereby achieving the automatic focusing. However, this method has a drawback that it takes long time for achieving the automatic focusing.

Then, according to the present invention, although applying the method of picking up the images in plural numbers thereof, differing each other at the focal position thereof, in the Z direction; however, this is achieved during the time-period of movement of the view field, thereby necessitating substantially no time for achieving the automatic focusing.

Hereinafter, explanation will be given in details thereof, about a scanning electron microscope, according to of embodiments of the present invention, by referring to FIGS. 1 to 7(c) attached herewith.

Figure 1:
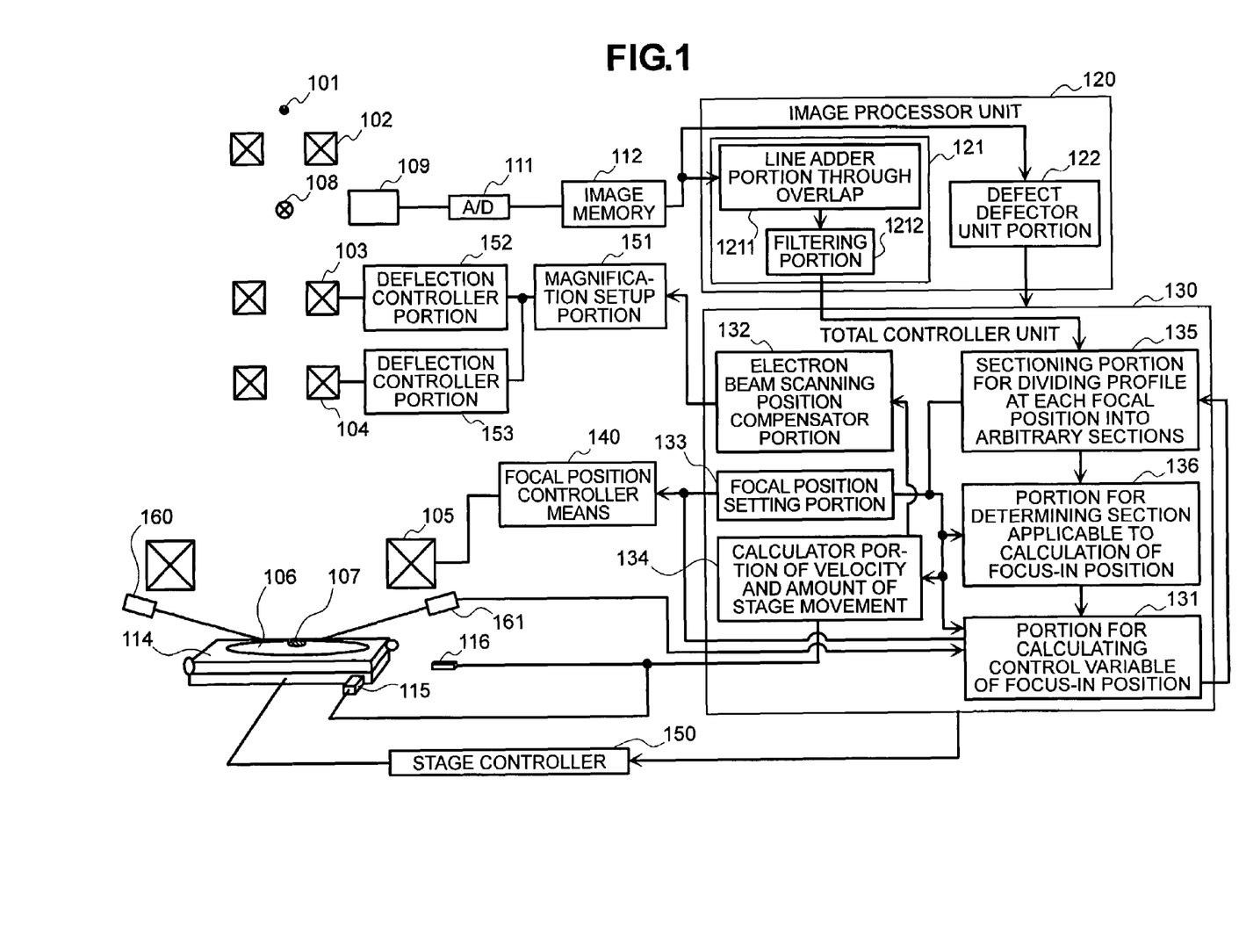
FIG. 1 is a view for showing the basic structure of the scanning electron microscope according to the present invention.

FIG. 1 shows the basic structure of the scanning electron microscope, according to the present invention.

A reference numeral 101 depicts a source of electron beams, which irradiates electron beams therefrom. The electron beams irradiated are focused by means of a condenser lens 102. The focused electron beam is deflected into X and Y directions, respectively, by means of scanning units (i.e., deflectors) 103 and 104, in which the deflection directions are controlled by direction deflection control portions 152 and 153, so that the position can be controlled, on which the electron beams are irradiated. Further, a reference numeral 151 depicts a magnification setup portion, with which the magnification can be set at a value from several thousands up to 150,000 times. Moreover, the electron beams are focused by means of an objection lens 105, to be irradiated upon an image-pickup target 107 on a wafer 106. As a result thereof, from the image-pickup target 107 are discharged secondary electrons and reflected electrons, and the secondary electrons and the reflected electrons are deflected by means of ExB 108, to be detected upon an electron detector 109. The secondary electrons and the reflected electrons, which are detected upon the electron detector 109 are converted into a digital image signal within an A/D converter 111, to be stored into an image memory (i.e., a digital image signal memory means) 112. A reference numeral 140 depicts a focal position controller means, which changes exiting current for the objection lens 105, so that it controls the focal position of the focused electron beam, e.g., height in Z direction so that a diameter of the beams comes down to the minimum. A reference numeral 114 depicts an X-Y stage for moving the wafer 106, so that an image of the wafer 106 can be picked up at an arbitrary position. Reference numerals 115 and 116 depict laser-type measuring apparatuses, each of which measures the position of the stage. And, within a stage moving velocity and moving amount calculator portion 134 of an total controller unit 130, a moving velocity and a moving amount of the stage are calculated out, upon basis of the position information of the stage, which is measured by means of the laser-type measuring apparatuses 115 and 116 (a moving amount in the view filed, being equal or less than about 30 μm, i.e., during when starting from picking up of an image up to when completing it, for use in the automatic focusing). A focal position setup portion 133 is for setting up each of the focal positions within an electron optic system, upon the basis of an area or a region, within which the determined focal potion can be changed. An electron beam scanning position compensator portion 132 is for adjusting or compensating the scanning position of electron beams, upon basis of the moving amount in the view field at the each focal position, which is calculated out within the stage moving velocity and moving amount calculator portion 134.

Figure 4A:
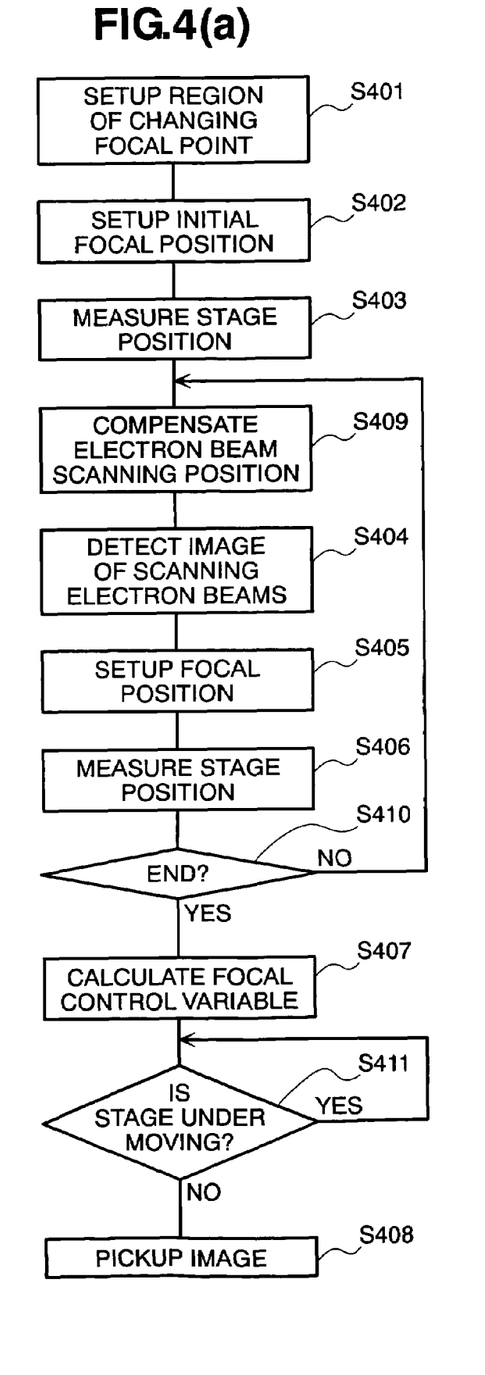
FIG. 4(a) shows that in a case where correction is necessary on the electron beam scanning position depending upon an amount of movement of a stage (i.e., when the stage is under the condition of moving), while FIG. 4(b) that in a case where no correction is necessary on the electron beam scanning position depending upon the amount of movement of the stage (i.e., when the stage is under the condition of stopping)

A focus-in position calculation image processor unit 121 within an image processor unit 120 is built up with a line adder portion 1211 of applying an overlap and also a filtering portion 1212. The line adder portion 1211 of applying an overlap makes up a function portion of inputting the images, each of which can be obtained by a one (1) line scanning of the focused electron beam at the each of the focal potions 1 through N, such as, line 1, line 2, . . . line N, for example, being obtainable from the image memory 112, and it overlaps three (3) lines to each, e.g., an image 2.5 by adding lines from the line 1 to the line 4, an image 3.5 by adding lines from the line 2 to the line 5, . . . an image N–1.5 by adding lines from the line N–3 to the line N, for example; thereby, obtaining an averaged image at the each focal position, shifting or moving by N–3 times in the position thereof. The filtering portion 1212 is built up with a band-pass filter, etc., for obtaining a profile signal, which is indicative of a focal condition, by passing through also lower spatial frequencies for the image signal at each of the focal positions (for example, 2.5, 3.5, . . . N–1.5), which can be obtained from the line adder portion 1211. A divider or sectioning portion 135, for dividing the profile at the each focal position into arbitrary sections, makes up a functioning portion, as is shown in FIG. 4(c), e.g., of dividing each into the arbitrary sections, for the profile signal (505, 506, . . . or 508) at the each focal position, which can be obtained from the filtering portion 1212. A determination portion 136, for determining the section to be applicable for use in the focus-in position calculation, makes up a function portion, for determining on whether it can be applied or not, in particular, for use in the focus-in position calculation, for each of the sections which are divided within the section divider portion 135. Thus, dividing a filter response waveform at the each focal position, which can be obtained from the filtering portion 121, into the arbitrary sections (for example, into the sections, being equally divided into M pieces), the determination portion 136 determines if it is applicable or not for use of the focus-in position calculation, upon the basis of the profile obtained from each of those divided sections. And, if being determined to be the applicable section, it is specified, but if being determined to be inapplicable, the scanning region of the focused electron beam may be widen or changed in the direction thereof.

Accordingly, a focus-in position control variable calculator portion 131 in the total controller unit 130 is for calculating out the focus-in position at accuracy, being equal or less than several to 1 μm, depending upon the magnifying power (from 10,000 times to 150,000 times), which is set up within the magnification setup portion 151, upon basis of the each focal position, which is given to the focal position controller means 140, and the profile signal indicative of the focal condition at the each focal position within the section applicable for the focus-in position calculation, which can be obtained from the determination portion 136 mentioned above. Of course, since a region of irradiating the focused electron beam should be changed depending upon the magnifying power, therefore also the focus-in accuracy can be changed.

A stage controller 150 is for moving and controlling the X-Y stage 114 upon the basis of an instruction from the total controller unit 130.

Also, when adjusting or compensating the position of electron beam scanning due to the movement of the stage, the total controller unit 130 makes measurement upon an amount of movement of the stage 114, which is suppressed to be equal or less than about 30 μm of the movement in the view field through the line addition with overlapping, by means of the laser measuring apparatuses 115 and 116, and it also makes control upon the irradiation position of the focused electron beam for the scanning units 103 and 104 through the deflection controller portions 152 and 153, so as to compensate or adjust the shifting amount of the stage 114, which is measured when picking up an image for each of the respective frames, thereby enabling to detect the images, which differ from each other in the focal position, at the same position of a focus-in point, by means of the electron detector 109, and as a result thereof, achieving the automatic focusing.

Reference numerals 160 and 161 depict the height detectors, which are described in the Japanese Patent Laying-Open No. Hei 11-183154 (1999) (i.e., the Patent Document 1 mentioned above), with which the surface of the wafer 106 can be roughly fitted at a focal reference position of the electron optic system. The reference numeral 160 depicts an optic system for projecting a grid-like stripe pattern, for example, onto the surface of the wafer 106, and the reference numeral 161 a detector for detecting the shift position of an optical image of reflection lights from the surface, depending upon the displacement in the Z direction upon surface of the wafer 106. In this manner, the surface of the wafer 106 can be fitted to the focal reference position, roughly, by means of the optic-type height detectors 160 and 161, and thereby enabling to set a changeable region of the focus to be narrow in the Z direction, by means of the focal position controller means 140, which will be mentioned later.

Also, a defect detector unit 122 within the image processor unit 120 makes up a portion for detecting defects, upon the basis of picked-up images detected by means of the electron detector 109 from the image-pickup target, under the condition of controlling the electron optic system into the focus-in condition, or for classifying those defects, or for reviewing fatalness of those defects. And, results of the inspection, the classification and the reviewing within the defect detector unit portion 122 are transmitted to the total controller unit 130, to be outputted on a screen of a display device.

Then, according to the present invention, though the automatic focusing can be achieved while shifting the view field by means of the X-Y stage for moving the wafer 106 thereon, however the following can be listed up, as a problem when irradiating the electron beams during when shifting the view field; i.e., the view field is also moved, so that it is impossible to irradiate the focused electron beam upon the same area or region, at the focal positions differing from each other in the Z direction.

Figures 3A, 3B:
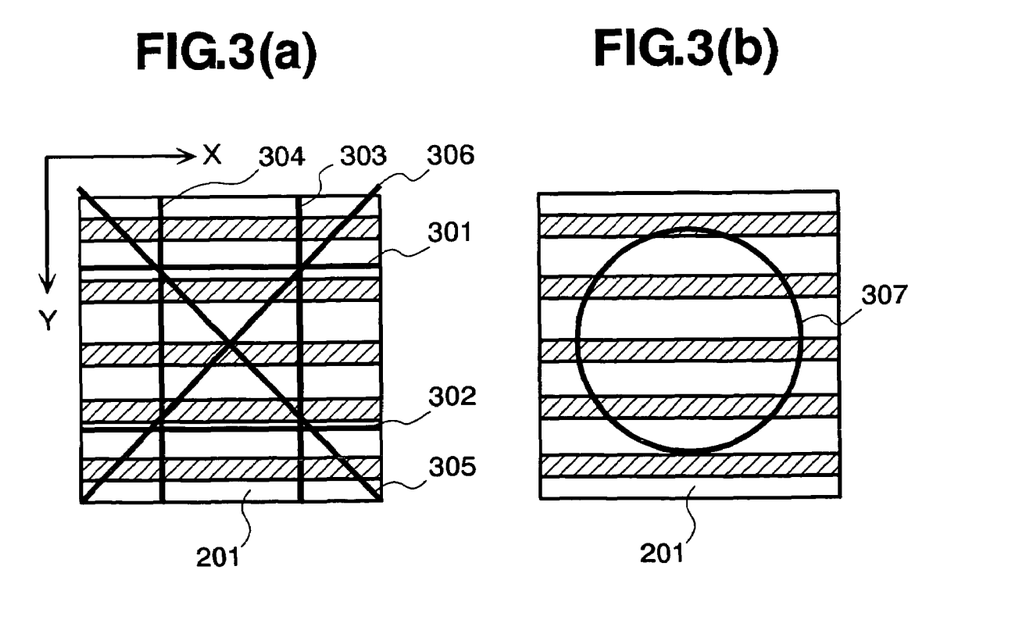

As a method for dissolving such problem, according to the present invention, the scanning area or region of the focused electron beam (i.e., the focus-in point) is restricted to be narrow, extremely, so that it comes up to be about 4 μm×4 nm, for example, in the case of one-directional line scanning (in the case where the magnifying power is high, such as, approximately 150,000 times), or about 4 μm×4 μm, for example, in the case of scanning the electron beam into plural directions, or a curved-line scanning, as shown in FIGS. 3(a) and 3(b) (in the case where the magnifying power is high, such as, approximately 150,000 times). The scanning area of the focused electron beam was about 13.5 μm×4 nm, under a low magnifying power, such as, approximately 10,000 times, for example, in the case of the one-directional line scanning, and it comes to about 13.5 μm×13.5 μm, in the case of a square view field, for example.

By the way, when achieving the automatic focusing, normally, it is impossible to make decision on whether texture (i.e., repetitive patterns) lies or not, anywhere within an area or a region, upon which the focused electron beam is irradiated; therefore, an image is picked up of a square area, through irradiation of the focused electron beam upon a relatively wide square view field (for example, about 4 μm×4 μm, in the case where the magnifying power is high, such as, approximately 150,000 times) while changing the focus into the Z direction. Then, a high-frequency response can be calculated out for this image, corresponding to the texture, upon the basis convolution calculation with the digital filter, which passes through only high spatial frequencies, and then it can be determined that the focus is fitted at the portion in Z direction, where the image having the high-frequency response can be obtained.

However, it is impossible to apply this method into, in particular, during the time when the stage is moving (under the condition of very low velocity). The reasons of this will be explained next. Thus, as was mentioned above, the SEM image is noisy, in general, and therefore, it is improved in the S/N, through conducting the frame addition thereupon. However, if it takes 33 ms to pick up an image of one (1) frame, then it takes about 132 ms for obtaining one (1) piece of image that can be obtained by adding four (4) frames at the respective focal positions. As a result, for obtaining ten (10) pieces of images by adding four (4) frames while changing the focal position ten (10) times, for example, thereby to find out the focus-in position upon the basis of those ten (10) pieces of images obtained; it needs about 1,320 ms.

On the other hand, in relation to the moving velocity of the stage, it is about 50 mm/s when conducting the step & repeat operation. As a result, there is generated a shift or movement of about 66 mm, in the view field, for achieving the automatic focusing; i.e., between the time when obtaining a first ($1^{st}$) piece of the images and the time when obtaining a tenth ($10^{th}$) piece thereof. In the case where there is generated the shift in the view field, in this manner, different patterns are picked up on the respective view fields; therefore, it is impossible to make determination, in particular, upon the difference of the response, which is caused due to the difference between the patterns, as being the image pick-up target, or due to the difference between the focal positions in the Z direction, even if picking up the high-frequency responses from the respective images.

Then, according to the present invention, first of all, the area or region is set to be narrow, extremely (for example, about 4 μm×4 μm), upon which the automatic focusing is achieved (i.e., the focus-in point). Normally, the image, upon which the automatic focusing is achieved, can be picked up through 512 times of scanning of the focused electron beam; however, if assuming that it be picked up by only one (1) time of scanning, then the image obtained by one (1) scanning comes down to 1/512 comparing to the normal time, 1,320 ms/512≈2.6 ms, and then the shift of the view field in this instance is about 130 μm.

However, with the SEM apparatuses, being able to pick up a highly magnified image, such as, 150,000 times or more or less, in many cases, the area or region, within which the view field can be move by means of the scanning units 103 and 104, is only about 30 μm, and therefore, by means of only the scanning units 103 and 104, it is impossible to achieve such the movement or shift of about 130 μm in the view field, as was mention above.

Then, according to the present invention, when trying to achieve the automatic focusing, the scanning of the focused electron beam is repeated, continuously (i.e., one (1) time of line scanning at the each focal position), while changing the focal position by N times (for example, thirteen (13) times) upon basis of the control from the total controller unit 130 to the focal position controller means 140, under the condition that the stage 114 moves at very low velocity, i.e., near to be stopped (during the movement of the stage). As a result of this, the line images that are picked up by N times are stored into the line memory 112. Herein, it is assumed that the images are a line 1, a line 2, . . . a line N, for example, each being obtained through the one-line scanning of the focused electron beam at each of those focal positions 1–N. Then, because the images obtained through the one-line scanning is noisy, an averaged image is obtained at the each focal position, which is changed by N–3 times, within about 330 ms/512≈0.6 ms, through letting each to have an overlapping with three (3) lines, such as, the image 2.5 by adding lines from the line 1 to the line 4 (corresponding to an averaged image at the focal position 2.5), the image 3.5 by adding lines from the line 2 to the line 5 (corresponding to an averaged image at the focal position 3.5), . . . an image N–1.5 by adding lines from the line N–3 to the line N (corresponding to an averaged image at the focal position N–1.5), for example. In this instance, the shift of the view filed is only about 30 µm, which is caused due to the movement of stage during the time when starting the image pickup to when completing it, for achieving the automatic focusing; therefore, it is possible to bring it within the region of position compensation for the electron beams, by means of the scanning units 103 and 104.

Then, at each of the focal positions of N times, measurement is made upon an amount of movement of the stage 114 under condition of being nearly to the stationary state, within about 30 µm, by means of the laser measuring apparatuses 115 and 116, and the total controller unit 130 controls the scanning units 103 and 104, so as to compensate the irradiation position of the focused electron beam by the amount of movement of the stage 114, which is measured; thereby, it is possible to detect the images at the same position, but differing in the focal positions thereof, by means of the electron detector 109. As a result thereof, it is possible to achieve the automatic focusing during the time when moving the stage at the very low velocity.

However, achieving the automatic focusing only from the data obtained from one (1) time of scanning at the each focal position, as was mentioned above, it is not always possible to obtain sufficient accuracy.

Figure 2A:
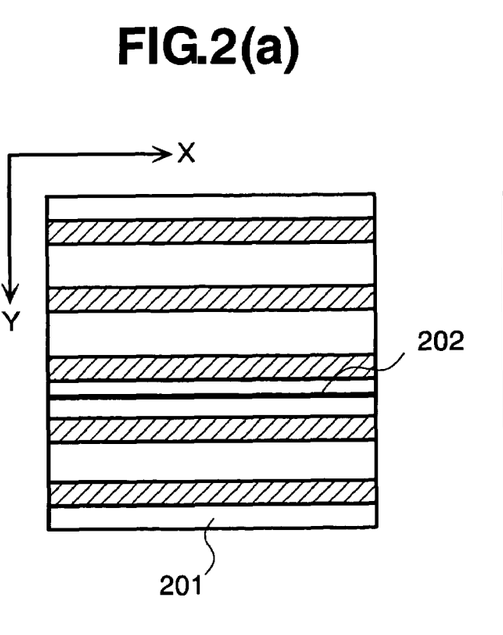
Figure 2B:
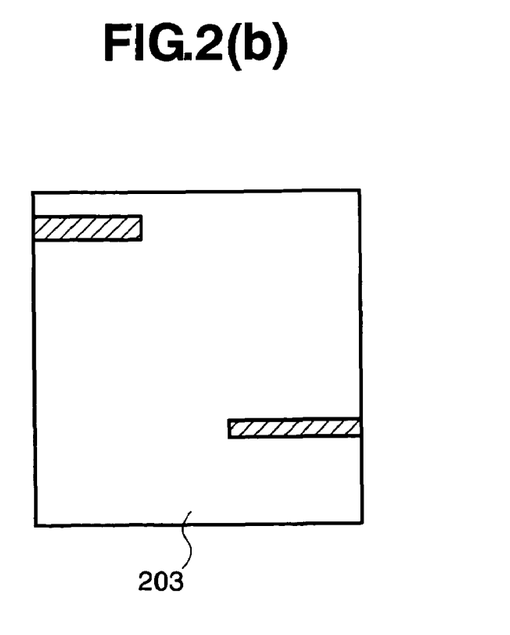
FIG. 2(b) shows a plane view of a sample having patterns, which are locally collated thereon.

Also, there is a possibility that various patterns are formed upon the surface of the wafer, as being the observation target, and with line-like repetitive patterns as shown by a reference numeral 201 in FIG. 2(a), for example, and then they have high-frequency components in the spatial frequency in the Y direction on the figure, but have no such the frequency component in the X direction. Herein, in a case when the scanning is made by use of the focused electron beam in the X direction, as indicated by a reference numeral 202, since no spatial frequency can be calculated out in the Y direction, it is impossible to achieve the automatic focusing upon the basis of the high-frequency response of the spatial frequency. And, in a case where such patterns appear, but locally, as is shown by a reference numeral 203 in FIG. 2(b), it is also impossible to calculate out the spatial frequency of the line-like repetitive patterns, even if irradiating the focused electron beam at the position where not pattern is formed thereon; therefore, it is impossible to achieve the automatic focusing.

In this manner, according to the present invention, since there is such the possibility that various patterns are formed upon the surface of the wafer 106, as being the observation target, as was mentioned above, therefore it is necessary to direct the direction of scanning of the focused electron beam, not only a single direction, but also into plural numbers of directions. For example, as is shown in FIG. 3(a), if scanning of the focused electron beam is made upon the pattern indicated by 201, in a manner as indicated by reference numerals 301-306, then it is possible to detect the high-frequency spatial frequencies along the scanning lines indicted by 301-306. As the method for making up such the scanning into the plural numbers of directions, other than that of the scanning so as to draw the plural lines, indicated by the reference numerals 301-306, there is also other one of changing the scanning direction, gradually, so as to draw a curved line by one (1) time of scanning, as is shown by a reference numeral 307; however, it does not matter to adopt either one of those methods, for achieving this.

Now, when making the scanning in such manner as is shown by 301 or 304, since the length of scanning comes to be longer, comparing to the case of scanning the one-line, and therefore if trying to make the number of electrons per a unit of scan length equal to each other, then it takes much time for the scanning; e.g., about 5 times longer, comparing to the case of scanning the focused electron beam in the manner as indicated by 202, for example. Then, although the length of movement of the view field was 30 µm, previously, which is caused due to the stage movement, i.e., during the time from when starting the pickup of images for use of the automatic focusing up to when completing it, in the case of scanning in the manner as indicted by 202; however, this length results into an increase up to about 150 µm, and therefore, it is impossible to adjust or compensate the movement in the view filed due to the movement of stage, but by means of the scanning units 103 and 104 (i.e., the deflector) only.

Then, according to the present invention, for the stage 114 moving in the manner of step & repeat, there is adopted a method of achieving the automatic focusing after the time when brake is effected upon the stage. It is possible to assume a condition, when the stage stops, that it moves 200 µm by taking about 200 ms just before it actually stops. Since the time necessary for picking up an image of scanning electron beams is only about 11.5 ms, for the automatic focusing, then the movement is 11.5 µm in the view field, during the time period when picking up the image of scanning electron beams for use of the automatic focusing; therefore, it is possible to compensate an amount of movement of the stage by means of the scanning units 103 and 104. Also, in the case where the image is picked up while irradiating the focused electron beam during when the stage 114 is moving continuously, it is possible to achieve the automatic focusing in the similar manner, anytime but not only within the time period of braking, because the moving speed or velocity of the stage is inherently slow.

Next, explanation will be made about the sequence of picking up the image of scanning electron beams for use of the automatic focusing, according to the present invention, by referring to FIGS. 4(a) and 4(b).

FIG. 4(a) is a view for showing a case where there is a necessity of making an adjustment or compensation upon the scanning position of electron beams due to the movement of stage (i.e., when conducting the focusing control upon basis of the image of scanning electron beams, which are detected under a condition where the stage is near to be stopped).

Figure 4B:
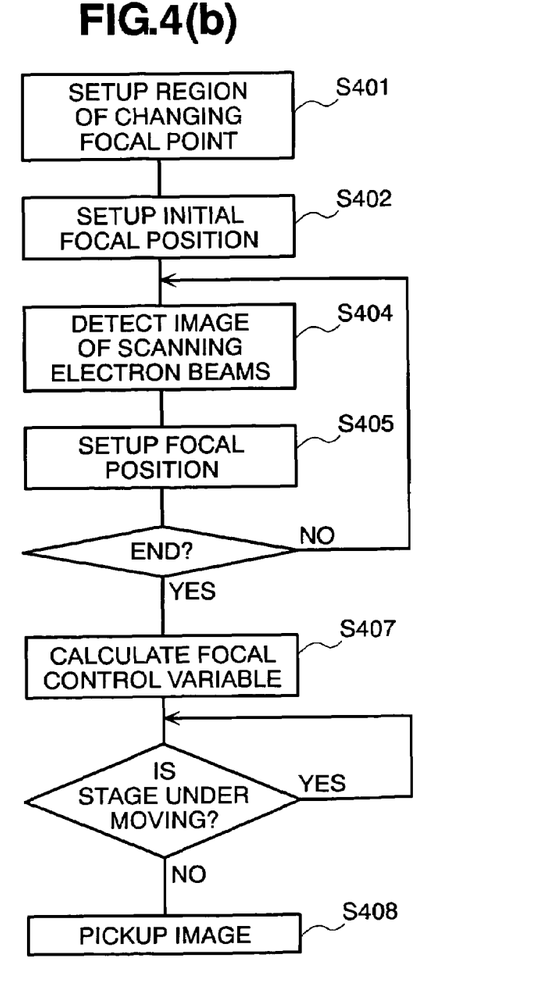

FIG. 4(b) is a view for showing a case where there is no necessity of making compensation on the scanning position of electron beams due to the movement of stage (i.e., when conducting the focus control upon basis of the image of scanning electron beams, which are detected under the condition that the stage is stopped).

First, explanation will be made, by referring to an image pickup sequence shown in FIG. 4(a). Thus, since the height upon surface of the image-pickup target 107 is always detected by means of the optical-type height detectors 160 and 161, to be fitted into the focus-in position (i.e., a reference position) of the electron optic system, then firstly, the focal position setup portion 133 of the total controller unit 130 determines a region or range (S401), within which the focal position could be changed, upon the basis of the reference focal position of the electron optic system, for the focal position controller means 140, and sets up the focal position of the electron optic system as an initial value thereof (S402), for the focal position controller means 140. At the same time, the scanning position compensator portion 132 of the total controller unit 130 sets up the X and Y compensation offset amounts to be zero (0), respectively, for the scanning units (the deflectors) 103 and 104, when measuring the reference position of the stage 114 by means of the laser measuring apparatuses 115 and 116. Next, the stage moving amount calculator portion 134 makes measurement upon a movement amount of the stage, at the time just before when the stage stops upon reaction of the braking thereon, or the movement amount of the stage moving at the low velocity, by means of the laser measuring apparatuses 115 and 116, respectively (S403), and then it calculates out deviation or an amount of change of the values that are measured (i.e., the movement amount of the stage, in the view field), so as to feed them back to the scanning position compensator portion 132. The scanning position compensator portion 132, upon basis of the deviation of the measurement values measured, which are fed back thereto, carries out the compensation on the scanning position of electron beams, by setting them into the scanning units (the deflectors) 103 and 104, in the form of the X and Y compensation offset values (S409). At the same time, on basis of the compensation control onto the scanning units (i.e., the deflectors) 103 and 104 of the total controller unit 130, the focused electron beam, which is adjusted or compensated on the scanning position thereof, is irradiated upon an extremely narrow area or region, which is determined as was mentioned above; thereby enabling to detect the image of scanning electron beams, which are discharged from the same position within the extremely narrow region, at an initial focal portion, by means of the electron detector 109 (S404). Also, the image of scanning electron beams at the initial focal portion, after being converted within the A/D converter 111, is memorized into the image memory 112 in the form of an image of digital signal (S404).

Next, the focal position setting portion 133 sets up the Z directional focal position with respect to the electron optic system (S405), for the focal position controller means 140 to pick up an image at a next focal position. Then, the stage moving amount calculator portion 134 measures the movement amount of the stage 114 by means of the laser measuring apparatuses 115 and 116 (S406), and it also calculates out the deviation on the value measured (i.e., the movement amount of the stage within the view field), thereby to feed it back to the scanning position compensator portion 132. And, then, upon basis of the deviation of the measurement values, which are fed back thereto, the scanning position compensator portion 132 sets them into the scanning units (i.e., the deflectors) 103 and 104, in the form of the X and Y offset amounts (i.e., the compensation amount for the scanning position of electron beams). If the picking-up of images for use in the automatic focusing is not yet completed at this time-point (S410), then the process turns back to the step S409; thereby, the focused electron beam is irradiated upon the extremely narrow region, while compensating the scanning position of electron beams upon the basis of the X and Y offset amounts which are set up again, and then the image is memorized into image memory 112 (S404), of the scanning electron beams that are discharged from the same position within the extremely narrow region (i.e., the focus-in position), but at the next focal position.

Herein, shifting the irradiation by an amount of the compensation offset depending upon the amount of movement of the stage, when irradiating electron beams at the each focal position (i.e., 2.5, 3.5, . . . N−1.5), it is possible to cause no change in position of the detected image itself of the scanning electron beams. However, since the image is noisy, which can be detected through the one-line scanning obtained from the electron detector 109, therefore, as was mentioned previously, within the overlap line addition portion 1211, the averaged image can be obtained within about 0.6 ms, at the each focal position that is changed by N−3 times, having three (3) lines overlap, for example, with respect to the images obtained through the one-line scanning of the focused electron beam at the respective focal potions 1 to N. At that time, the movement on the view field is about 30 μm, which is caused due to the movement of stage from when starting the image pickup for use of the automatic focusing up to when completing it; therefore, it is possible to bring the movement of the view field, within the compensation region of the electron beam scanning position by means of the scanning units 103 and 104.

Then, when the image pickup for use of the automatic focusing is completed at S410, then at S407, the processing of band-pass filter is conducted within the filtering portion 121 of the image processor unit 120, for passing through also the lower spatial frequencies, upon the basis of the images of scanning electron beams at the respective focal positions, which are stored within the image memory 112; thereby, obtaining profile signals (501, 502, 503, and 504) shown in FIG. 5(*b*). The sectioning portion 135 makes division into arbitrary sections (for example, 1 to M) upon the profile signal at the each focal position, as shown in FIG. 5(*c*). The determining portion 136, as shown in FIG. 5(*d*), conducts approximating analysis (i.e., the Gauss function approximation, the parabola approximation, the multinomial function approximation, etc.) upon profile distribution (or, power distribution) P(i,j) at the each focal position, thereby making determination on whether that section can be applied or not for calculation of the focus-in position. If being determined to the applicable section in that determination, then the profile signals at the respective focal positions within that section are transmitted to the focus-in position control variable calculator portion 131. Then, the focus-in position control variable calculator portion 131 obtains the focus control variable for picking up a focus-in image, within accuracy from several to 1 μm or less than that (S407), upon basis of the respective focal positions, which are given to the focal position controller means 140, and the profile signals indicative of the focal conditions at the respective focal positions within the section applicable for calculation of the focus-in position, which can be obtained form the determining portion 136.

However, as the profile signals to be used for determining on whether the section is applicable or not for calculation of the focus-in position within the determining portion 136, signals may be used, which are processed through the band-pass filtering within the filtering portion 1212, while as the profile signals within a specific section to be used for calculating the focus-in position within the focus-in position control variable calculator portion 131, signals may be used, which are processed through the high-pass filtering within the filtering portion 1212. When picking up a high-density pattern under the condition when the stage is stopped, signals may be used, which are processed through the high-pass filtering within the filtering portion 1212.

Next, when the stage 114 is in the stopping condition or in the condition of extremely slow velocity thereof, at the step S411, the total controller unit 130 controls excitation current for the objection lens 105, through the focal position controller means 140, with using the focus control variable, which is obtained within the focus-in position control variable calculator portion 131; thereby, compensating the focal position of the electron optic system at the optimal. And, it picks up a SEM image of the image pickup target by means of the electron detector 109, while irradiating the focused electron beam upon the image pickup target 107 under the focus-in condition thereof (S408). The defect detector unit portion 122 of the image processor unit 120 performs defects inspection, defect classification and/or review of defects, upon basis of the SEM images that are picked up.

Next, explanation will be given about the image picking-up sequence shown in FIG. 4(b). The image picking-up sequence shown in FIG. 4(b) is carried out under the condition where the stage is stopped; therefore, it is omitted from the stage position measuring step S403, the electron scanning position compensating step S409 and the stage position measuring step S406, which are shown in FIG. 4(a).

With the present method as was mentioned above, in particular when the density of patterns is relatively high, it can be expected that the focused electron beam, which is scanned as shown in FIGS. 3(a) and 3(b), detects an image of any one of patterns on the wafer; therefore, the automatic focusing can be carried out, preferably.

However, there is also a portion where the patterns are formed at low density on the semiconductor wafer. With the method of conducting the automatic focusing while stopping the stage, since there is no movement of the stage, it is possible to irradiate the focused electron beam over an area relatively wide, and as a result thereof, it is possible to achieve the automatic focusing upon basis of the pattern picked up at the position, upon which are formed at low density thereof.

According to the method of the present invention, due to the necessity of conducting the automatic focusing during when the stage is moving, as was explained in the above, it is possible to irradiate the focused electron beam, but only upon the narrow area or region, as was shown in FIGS. 3(a) and 3(b), and as a result of this, it is impossible to scan the focused electron beam on the patterns, in particular, when the pattern density thereof is low. Then in such case, it is preferable to achieve the automatic focusing after stopping the movement of the view field, in accordance with the method of irradiating the focused electron beam over a wide region or area while widening the region of movement of the stage 14 through the stage controller 150 upon basis of an instruction from the total controller unit 130.

Figure 5A:
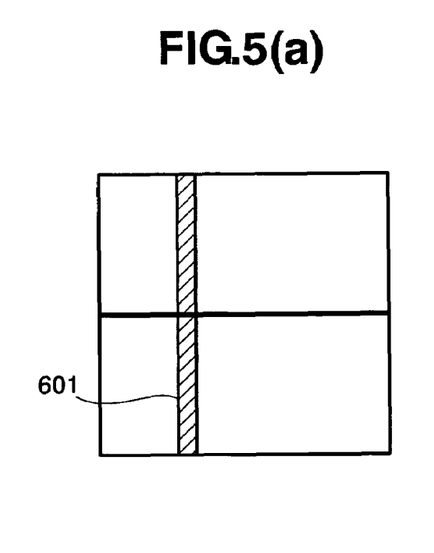
FIG. 5(a) shows a plane view of the sample of an inspection target (an inspection target sample)
Figure 5B:
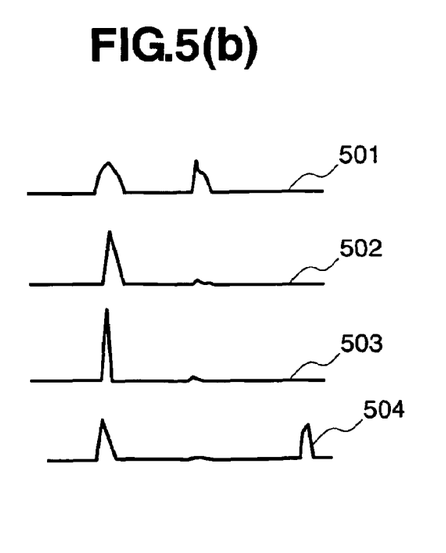
FIG. 5(b) shows waveforms of profile signals obtained through conducting a band-pass filtering process upon a scanned electron beam image, which can be obtained by scanning the focused electron beam upon the inspection target sample.
Figure 5C:
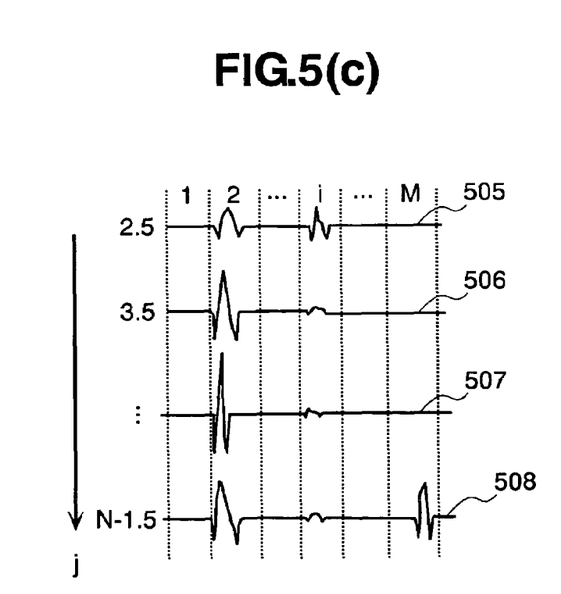
FIG. 5(c) shows the waveforms of profile signals, being sectioned or divided into arbitrary sections thereof.
Figure 5D:
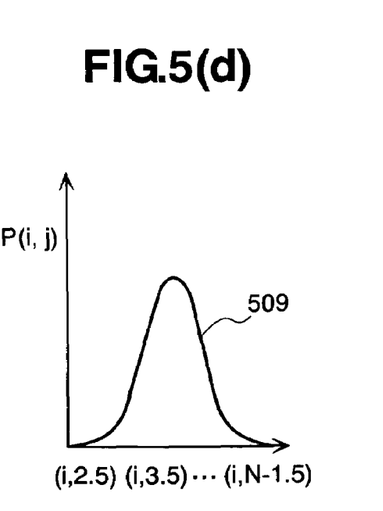
FIG. 5(d) shows profile distribution (or power distribution) P(i,j) at each of the focal points, respectively.
Figure 6A:
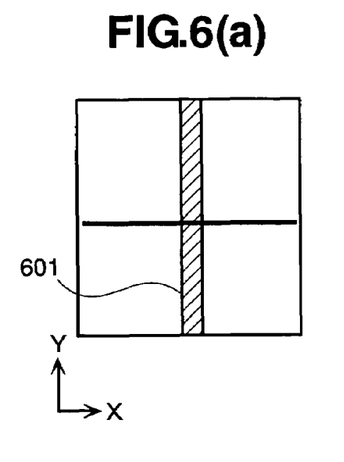
FIG. 6(a) shows a plane view of the inspection target sample, while FIG. 6(b) also shows a plane view of the inspection target sample.
Figure 6B:
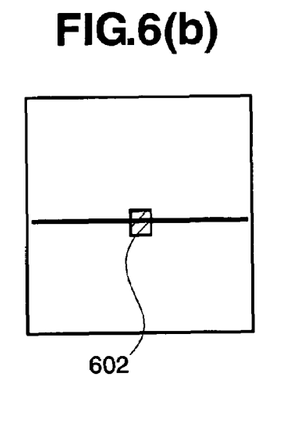

The problem to be dissolved, herein, is a method for making determination on whether the automatic focusing can be achieved or not, preferably, during the movement of the view field. According to the present invention, upon basis of the spatial frequency analysis obtained within the filtering portion 121 of the image processor unit 120, in relation to the image for use of calculating the focal potion in the Z direction, which is detected through the focused electron beam being scanned during when the view field is moving, the section applicable for calculating the focus-in position is calculated out, within the sectioning portion 135 and the determining portion 136 of the total controller unit 130, and if there is no such section, or if the section length (width of the profile) is so short that the focal position cannot be expected to be calculated with stability, then it is determined that focus-in cannot be obtained through the automatic focusing during when the view field is moving. The basic idea of this processing is shown in FIGS. 5(a) and 5(b). FIG. 5(a) shows the condition where the focused electron beam is scanned on a line. Those indicated by reference numerals 501-504 depict brightness profiles of the images for use of automatic focusing, which are picked up at the focal positions (2.5, 3.5, ... N−1.5), each being different in the Z direction, and they are detected in the step S404 and are added with, overlapping on each other, within the line adder portion 1211. Next, the profiles are indicated by reference numerals 505-508, which are obtained after processing those images through the band-pass filter of spatial frequency within the filtering portion 1212. As such the band-pass filter, though it is possible to apply a high-pass filter of applying the focal position being in focus at the most; however more preferably, there is applied a band-pass filter for passing through the spatial frequencies, which are different from them and are lower than that thereof.

According to the method of the present invention, the focused electron beam is irradiated upon the same region, but at the different focal positions, as far as possible, however, because this is conducted during when the view field is moving; therefore, there is a tendency that the compensation error on the scanning position upon basis of measurement of an amount of the stage movement, in particular, when the beam diameter of the focused electron beam is small, for the purpose of dealing with a case where the target pattern is fine or minute. For this reason, there is a possibility that they are those that are obtained as a result of scanning of the electron beams, which are scanned at the focal positions different in the Z direction; i.e., at positions being different in the profile thereof. Then, there is a necessity of determining the position, at which the stable profile can be obtained even if the scanning portion is changed a little bit, to be the section, which can be applied for the calculation of the focus-in position. This is because, for example, when scanning the focused electron beam upon a pattern shown by 601 in FIG. 6(a), in the direction being orthogonal to that pattern, it is possible to obtain a stable profile thereof, if the scanning line is shifted in the Y direction; however, when scanning it upon such the position as shown by 602 in FIG. 6(b), for example, there are mixed up the cases, i.e., obtaining the profile on the pattern for each of the focal positions in the Z direction and obtaining no such profile; therefore, it is impossible to discriminate upon if the high-frequency components of the pattern cannot be obtained due to being out of focus, or only the electron beam comes out of the pattern. Herein, since the high-frequency response falls down quickly if the profile detected comes out from fitting in the focus a little bit, it is impossible to detect the response, with stability, only through a small number of profiles detected, if applying the high-pass filter for passing through only the high-band of the spatial frequency; therefore, it is difficult to determine on if the electron beams comes out from the pattern or in the focus thereof. Then, applying the band-pass filter for passing through the lower spatial frequencies, in particular, into the filtering portion 1212, it is possible to detect that pass-through response through obtaining a larger number of profiles thereof.

In this manner, if assuming that the profiles can be detected from the same pattern, with stability, then the filter response, which is obtained at the same position within the respective focal positions in the Z direction, comes to have the maximum strength or intensity, on the profile at the focus-in position, and goes down to be small as it comes out from the focus-in position.

Further, within the sectioning portion 135, the filter response waveforms, as shown by 505-508 in FIG. 5(*c*), are sectioned or divided into arbitrary sections (being equally divided into M pieces, for example), as is shown in the same figure, and in the determining portion 136, an average is obtained on the power of the filter responses, at each section "i". Then, power distribution P(i,j) within the section "i" at the focal position "j" can be approximated by the Gauss function, having a peak equal to an average on power of the filter responses, which are obtained from the profile at the focus-in position. Then, within the determining portion 136, if the peak of this Gauss function exceeds a threshold value set up, and if the difference is small between the power of filter response obtained from each of the profiles and that Gauss function, and further if dispersion of the Gauss function differs from a value preset in advance, greatly, it is possible to determine that it is the section being applicable for calculation of the focus-in position. In this manner, the section can be specified or identified to be applicable for calculation of the focus-in position, and if there cannot found out such the section, or if the section length (i.e., width of the profile) applicable for calculation of the focus-in position is shorter than the threshold value, which is preset in advance, then it is determined that the focal position cannot be obtained from the images picked up during when conducting the movement of the view filed.

However, in the explanation given in the above, although the power distribution P(i,j) within the section "i" at the focal position "j" can be approximated by means of the Gauss function, but it can be approximated by others, such as, a parabolic function, a multinomial function, for example.

Heretofore, explanation was given, the band-pass filter is applied therein, in particular, for passing the lower spatial frequencies into the profiles to be obtained, for the purpose of determining on whether it is possible or not, to achieve the automatic focusing control by using the images, which are detected during when the view filed is moving, and also in the case if determining to be impossible, for achieving the automatic focusing control, again, but after completing the movement of the view field.

Further, after completing the movement of the view filed, in particular, when trying to achieve the automatic focusing, again, it is possible to use a high-pass filter as the filtering portion 1212.

However, identifying the section to be applicable for calculation of the focus-in position brings about an effect of improving accuracy of calculating out the focal position, even in a case where the automatic focusing will not be executed, again, after completing the movement of the view field.

Figure 7A:
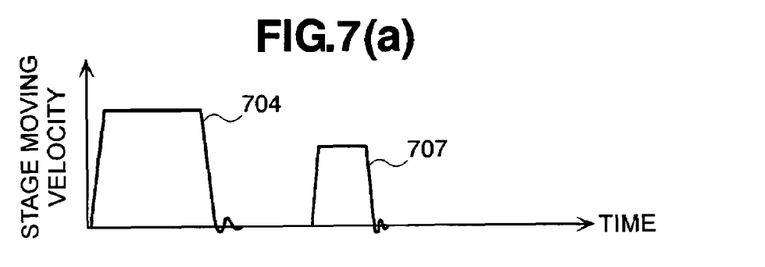
FIG. 7(a) shows a timing chart for showing changes in moving velocity of a stage within ADR sequence of a preview SEM apparatus.
Figure 7B:
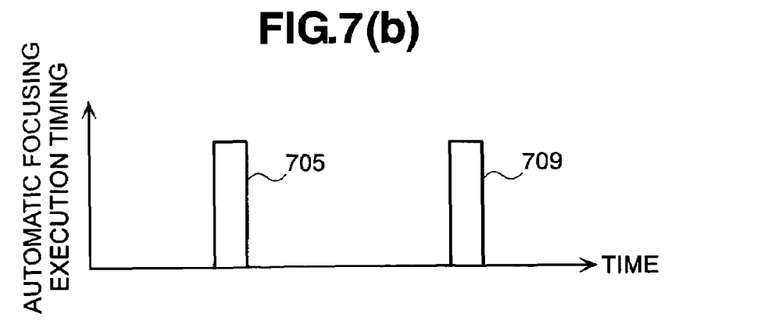
FIG. 7(b) shows a timing chart for showing timing of executing an automatic focus within the ADR sequence of the preview SEM apparatus.
Figure 7C:
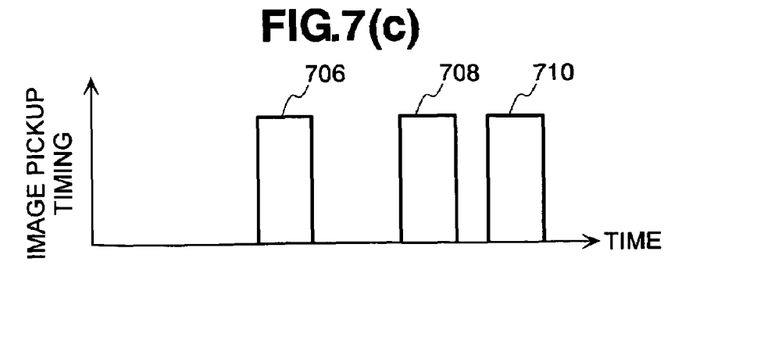
FIG. 7(c) shows a timing chart for showing an image pickup timing of an image within the ADR sequence of the preview SEM apparatus, respectively.

Next, explanation will be made about the case where the focus-in control by using the focused electron beam is applied into the review SEM apparatus, according to the present invention. FIGS. 7(*a*) to 7(*c*) show timing charts within an ADR sequence of the review SEM apparatus. Within the ADR sequence of the review SEM apparatus, the images are picked up though the electron optic system, and are memorized into the image memory 112, in an order, a low magnification reference image and then a low magnification defect image, for example, while setting the magnification power to be low within the magnification setting portion 151, and the defect detector unit portion 122 of the image processor unit 120 detects the position of the defect(s) upon the defect image of the low magnification, through comparison between the two (2) images mentioned above. Then, the total controller unit 130 makes a compensation on the view field upon basis of the position information of the defect(s) on said lower magnification defect image detected, so that an image of the defect can be picked up at a center thereof, and it also sets up the high magnifying power within the magnification setting portion 151; thereby, picking up a defect image of high magnifying power by means of the electron detector 209 through the electron optic system. Herein, the reference image means an image of a portion, being same in a coordinate system where the defect occurs, which is make up through the same designing, and in general, the image is applied as such the reference image, which is picked up from a chip neighboring to that, in which the defect is generated, at the same position within the coordinate system of the chip.

FIG. 7(*a*) shows a moving velocity of the stage, while FIG. 7(*b*) an execution timing of the automatic focusing, and FIG. 7(*c*) an image pickup timing of the image. A reference numeral 704 depicts the movement of stage, so as to bring the reference image of low magnification into the view field.

During the movement of stage, the total controller unit 130 decelerates the stage 114, when the stage comes up to a vicinity of a target point of movement thereof, and if the velocity of the stage comes down to be lower than a predetermined velocity, which is calculated out within the stage moving velocity calculator portion 134, then it begins the automatic focusing control in accordance with the image picking-up sequence shown in FIG. 4(*a*) mentioned above, at the timing indicated by 705. The automatic focusing control is completed before the stage 114 stops, and the pickup of an image is executed upon the reference image of low magnification at the timing indicated by 706, in synchronism with the stoppage of stage, to be memorized into the image memory 112. Next, the total controller unit 130 moves the stage 114 by a distance for one (1) piece of chip at the timing 707, and at the timing indicated by 708, the pickup of an image is executed upon the defect image at the low magnification power, to be memorized into the image memory 112. In general, since the condition of electrical charging is almost equal at the same positions on a wafer, in particular, between two (2) pieces of chips, being separated only by a distance of one (1) pieces of chip; therefore, there is no necessity of achieving the automatic focusing for picking up the defect image of low magnifying power, and then an amount of the focus controlling can be set up, upon the basis of the control variable, which was calculated out through the automatic focusing achieved for the reference image.

Next, the total controller unit 130 tries the automatic focusing control for picking up a defect image at high magnification power at the timing indicated by 709. Since the stage 114 makes no movement in this instance, then the automatic focusing control is conducted in accordance with the image picking-up sequence shown in FIG. 4(*b*) mentioned above.

In synchronism with this, the defect detector unit portion 122 of the image processor unit 120 identifies the defect position upon basis of the defect image of low magnifying power and the reference image of low magnifying power, which are memorized into the image memory 112, and it provides information about that identification, to the total controller unit 130. Next, the total controller unit 130 executes such control that an image can be picked up at high magnifying power upon the defect, being identified upon the basis of the identification information provided thereto.

In the sequence shown in FIGS. 7(a) to 7(c), the automatic focusing control is executed at the timing 705 and 709; however, at the timing 705, the movement of stage and the automatic focusing control are executed in parallel with, according to the present invention, and as a result of this, no waiting time is generated for the automatic focusing control. Also, in relation to the automatic focusing control at the timing 709, since it is possible to execute the identification of the defect position and the automatic focusing control in parallel, therefore substantially no time is necessary for achieving the automatic focusing.

Though explanation was given about the case of being applied into the review SEM apparatus in FIGS. 7(a) to 7(c), however it is, of course, that the automatic focusing control according to the present invention can be applied into various apparatuses, with using the scanning electron microscope therein, such as, a measurement SEM apparatus, an inspection SEM apparatus, and a general-purpose SEM apparatus, and so on, for example, but without loosing general characteristics thereof.

Now, explanation heretofore was given about the method of achieving the automatic focusing during when the stage is moving, however, the method mentioned according to the present invention is also applicable into the timing after stoppage of the stage stops, but without loosing general characteristics thereof. Merits or advantages of applying the automatic focusing control lies in that, in particular, after when the stage stops, the region or area can be narrowed, where the focused electron beam is scanned thereon for the automatic focusing, and as a result thereof, it is also possible to shorten the time necessary for achieving the automatic focusing. On the other hand, as a problem to be dissolved, since the region comes to be narrow where the focused electron beam should be scanned thereon; therefore, there may be caused a possibility that the electron beams cannot make scanning on the pattern, in particular, when trying to achieve the automatic focusing at within the position where the pattern density is loose, and in such the case, the automatic focusing cannot be achieved.

However, this problem can be dissolved, by means of the method that was mentioned above, previously. Namely, it is determined on if the automatic focusing can be achieved or not, upon the basis of the imaged obtained through the scanning the electron beams at plural numbers of times upon the narrow region that is set up, while changing the focal position in the Z direction. As a result thereof, if determining that the automatic focusing cannot be achieved, then an area is set up, being wider than the region where the scanning is made with the focused electron beam first time, as to be a region of scanning the focused electron beam for use of automatic focusing, thereby trying to achieve the automatic focusing through scanning over the region set up while changing the focal position in the Z direction, again. In particular, in a case where a very wide region is constructed with memory cells, such as, a memory, for example, upon the wafer, a possibility is high that the pattern portion can be scanned even through the scanning of electron beams onto the first narrow area, and therefore, it is possible to reduce the time necessary for the automatic focusing, greatly, as a whole thereof.

The invention maybe embodied in other specific forms without departing from the spirit or essential characteristics thereof. The present embodiments is therefore to be considered in all respects as illustrative and not restrictive, the scope of the invention being indicated by the appended claims rather than by the forgoing description and all changes which come within the meaning and range of equivalency of the claims are therefore to be embraces therein.

What is claimed is:

1. A scanning electron microscope, comprising:
   an electron optic system having an electron source of electron beams, an electron lens for focusing said electron beams, so as to generate a focused electron beam, a deflection portion for deflecting an irradiation position of said focused electron beam within a view field, so as to irradiate the focused electron beam upon an observation target, an electron detector for detecting secondary electrons or reflecting electrons which are discharged from said observation target and converted into a signal, and a focal position controller for controlling a focal position of said focused electron beam;
   an AD converter/memory unit for converting the signal of the secondary electrons or the reflecting electrons detected by said electron detector of said electron optic system into a digital signal which is memorized into a memory;
   a view field moving unit for moving said electron optic system or an image-pickup target, relatively, so as to move the view filed, upon which said electron optic system picks up an image of said image-pickup target;
   a first electron beam irradiation controller portion for obtaining an intensity signal for use of calculating a focus-in position, through detecting the secondary electrons or the reflecting electrons obtained from a focus-in point at each of said focal positions by the electron detector of said electron optic system, irradiating the focused electron beam, being compensated scanning position thereof by compensating scanning position of said focused electron beam, through controlling said deflection portion depending upon an amount of movement of said view field, at each of the focal positions, while changing the focal position in a Z direction through controlling said focal position controller, under a condition of moving the view field for said electron optic system to pick up an image of said observation target by said view filed moving portion, and for convert it into the digital signal through said AD converter/memory unit, to be memorized into the memory; and
   a first focus-in position control variable calculating unit, having an analysis portion for calculating out a focus-in position through analyzing the intensity signal for use of calculating the focus-in position at each of the focal positions, which are memorized in said memory by means of said first electron beam irradiating position controller portion, and for calculating out a control variable of said focal position controller upon basis of the focus-in position which is calculated within said analysis portion, wherein
   said focal position controller is controlled upon basis of the control variable, which is calculated within said first focus-in position control variable calculating portion, so that an image is picked up of a predetermined region upon said image-pickup target through said electron optic system under a condition of being in focus.

2. The scanning electron microscope, as described in the claim 1, wherein said view field moving potion is constructed by a stage mounting said image-pickup target thereon.

3. The scanning electron microscope, as described in the claim 1, further comprising a measurement portion for measuring an amount of movement in the view field, which is moved by means of said view field moving portion, and within said first electron beam irradiation controller portion, the scanning position of said focused electron beam is compensated through controlling said deflection portion depending upon the movement amount of the view filed, which is measured by said measurement portion.

4. The scanning electron microscope, as described in the claim 1, wherein said first electron beam irradiation controller is so constructed that, said focused electron beam compensated the scanning position thereof is irradiated at the focus fitting point upon said image-pickup target while scanning it into plural numbers of directions.

5. The scanning electron microscope, as described in the claim 1. wherein a condition of moving the view field, for said electron optic system to pick up the image of said image-pickup target, is obtained by said view field movement controller, through effecting brake upon said view field moving portion, within said first electron beam irradiation controller.

6. The scanning electron microscope, as described in the claim 1, wherein the analysis portion of said first focus-in position control variable calculating portion is so constructed, a band-pass filter is applied onto the intensity signal for use of calculating a focus-in position at each of the focal positions, sectioning is made upon an output profile of said band-pass filter into arbitrary plural numbers of sections, identifying the section to be a section, upon which a focus-in position control variable can be calculated, among said plural numbers of sections divided, of which the output profile of the band-pass filter is larger than a reference for determination, and the focus-in position is calculated out by analyzing the intensity signal for use of calculating the focus-in position at each of the focus positions within said section identified.

7. The scanning electron microscope, as described in the claim 6, further comprising:

a second electron beam irradiation controller for obtaining an intensity signal for use of calculating a focus-in position, through detecting the secondary electrons or the reflecting electrons obtained from the focus fitting point at each of said focal positions by the electron detector of said electron optic system, irradiating the focused electron beam, being compensated scanning position thereof by compensating scanning position of said focused electron beam, through controlling said deflection portion depending upon an amount of movement of said view field, at each of the focal positions, while changing the focal position in a Z direction through controlling said focal position controller, under a condition of stopping the view field by said view field moving portion, when it is impossible to identify the section, on which the focus-in position control variable can be calculated our, in the analysis portion of said first focus-in position control variable calculating portion, and for convert it into the digital signal through said AD converter/memory unit, to be memorized into the memory; and a second focus-in position control variable calculating unit, having an analysis portion for calculating out a focus-in position through analyzing the intensity signal for use of focus-in position calculation at each of the focal positions, which are memorized in said memory by means of said second electron beam irradiating position controller portion, and for calculating out a control variable of said focal position controller upon basis of the focus-in position which is calculated within said analysis portion, wherein said focal position controller is controlled upon basis of the control variable, which is calculated within said second focus-in position control variable calculating portion, so that an image is picked up of a predetermined region upon said image-pickup target through said electron optic system under a condition of being in focus.

8. The scanning electron microscope, as described in claim 7, further comprising:

a third focus-in position controlling control variable calculating unit for calculating a focus-in position, when it is determined that a focus-in position can be calculated out through analysis of the intensity signal for use of calculation of the focus-in position at ach of the focus-in positions, which are memorized into said memory by said second, and thereby calculating out a control variable for said focal position controller upon basis of said focus-in position which is calculated out;

wherein said focus position controller is controlled upon basis of the control variable, which is calculated out within said third focus-in position controlling control variable calculating unit, thereby picking up an image of a predetermined area on said image-pickup target by said electron optic system under a focus-in condition.

9. The scanning electron microscope, as described in the claim 1, further comprising:

a second electron beam irradiation controller for obtaining an intensity signal for use of calculating a focus-in position, through detecting the secondary electrons or the reflecting electrons obtained from the focus fitting point at each of said focal positions by the electron detector of said electron optic system, irradiating the focused electron beam, being compensated scanning position thereof by compensating scanning position of said focused electron beam, through controlling said deflection portion depending upon an amount of movement of said view field, at each of the focal positions, while changing the focal position in a Z direction through controlling said focal position controller, under a condition of stopping the view field by said view field moving portion, when the focus-in position control variable cannot be calculated in the analysis portion of said first focus-in position control variable calculating portion, and for convert it into the digital signal through said AD converter/memory unit, to be memorized into the memory; and a second focus-in position control variable calculating unit, having an analysis portion for calculating out a focus-in position through analyzing the intensity signal for use of focus-in position calculation at each of the focal positions, which are memorized in said memory by means of said second electron beam irradiating position controller portion, and for calculating out a control variable of said focal position controller upon basis of the focus-in position which is calculated within said analysis portion, wherein.

said focal position controller is controlled upon basis of the control variable, which is calculated within said second focus-in position control variable calculating portion, so that an image is picked up of a predetermined region upon said image-pickup target through said electron optic system under a condition of being in focus.

10. The scanning electron microscope, as described in the claim 1, further comprises an optical height detector for detecting height of a surface of said image-pickup target, optically.

11. The scanning electron microscope, as described in claim 1, wherein said analysis portion has an overlap-line adder portion for obtaining an intensity signal, being averaged through overlapping intensity signals at the respective focal positions neighboring with each other, sequentially over the plurality of the focal positions, and then line-addition thereof.

12. The scanning electron microscope, as described in claim 1, further comprising:
an optical height detector for detecting height of the surface of said image-pickup target.

13. A scanning electron microscope, comprising:
an electron optic system having en electron source of electron beams, an electron lens for focusing said electron beams, so as to generate a focused electron beam, a deflection portion for deflecting an irradiation position of said focused electron beam within a view field, so as to irradiate the focused electron beam upon an observation target, an electron detector for detecting secondary electrons or reflecting electrons which are discharged from said observation target and converted into a signal, and a focal position controller for controlling a focal position of said focused electron beam;
an AD converter/memory unit for converting the signal of the secondary electrons or the reflecting electrons detected by said electron detector of said electron optic system into a digital signal which is memorized into a memory;
a view field moving unit for moving said electron optic system or the observation target, relatively, so as to move the view field, upon which said electron optic system picks up an image of the observation target;
a first electron beam irradiation controller for obtaining an intensity signal for use of calculating the focus-in position through irradiating a focused electron beam onto a focused electron beam scanning region A while the observation target is being moved by the view field moving unit, so that scanning position of said focused electron beam comes to be same to or in vicinity thereof at each of the focal positions while changing the focal position an irradiation direction of the focused electron beam by controlling said focal position controller, and detecting the secondary electrons or the reflecting electrons obtained from said focused electron beam scanning region A at each of the focal positions by said electron detection of said electron optic system, thereby converting it into the digital signal through said AD converter/memory unit, to be memorized into the memory;
a second electron beam irradiation controller for obtaining an intensity signal for use of calculating the focus-in position through irradiating said focused electron beam while scanning it over a focused electron beam scanning region B, being wider than said focused electron beam scanning region A, and detecting the secondary electrons or the reflecting electrons obtained from said focused electron beam scanning region B at each of the focal positions by said electron detection of said electron optic system, when it is determined that the focus-in position cannot be calculated through analysis of the intensity signal for calculating the focus-in position at each of the focal positions, which are memorized in said memory, by said first electron beam irradiation controller, thereby converting the detected secondary electron or the reflecting electrons detected by said electron optic system into the digital signal through said AD converter/memory unit, to be memorized into the memory; and
a second focus-in position control variable calculating portion for calculating out the focus-in position through analysis of the intensity signal for use of calculating the focus-in position at each of the focus positions, which are memorized in said memory, by said second electron beam irradiation controller, and for calculating out a control variable of said focal position controller upon basis of said focus-in position calculated, wherein
said focal position controller is controlled upon basis of the control variable, which is calculated within said second focus-in position control variable calculating portion, so that an image is picked up of a predetermined region upon said image-pickup target through said electron optic system under a condition of being in focus.

14. The scanning electron microscope, as described in the claim 13, further comprising:
a first focus-in position control variable calculating portion for calculating out the focus-in position when it is determined that the focus-in position can be calculated but through analysis of the intensity signal for use of calculating the focus-in position at each of the focal positions, which are memorized in said memory, by said first electron beam irradiation controller, thereby calculating out a control variable for said focus position controller upon basis of said focus-in position calculated
said focal position controller is controlled upon basis of the control variable, which is calculated within said first focus-in position control variable calculating portion, so that an image is picked up or a predetermined region upon said image-pickup target through said electron optic system under a condition of being in focus.

15. A method for adjusting a focal position of an electron beam of an electroscope, comprising the following steps of:
setting up an area where change is made on a focal position of electron beam, to be irradiated upon a sample for scanning thereon;
measuring a position of a table, on which the sample is mounted;
obtaining plural numbers of scanning electron beam images of a predetermined pattern on said sample, differing from each other on the focal position, through conducting a scan with irradiating said electron beam upon a same pattern on said sample mounted on said table, based on of the position information which is measured, while changing the focal position thereof, sequentially, within the area set up;
producing plural numbers of synthetic pictures through piling a portion of the plural numbers of electron beam images, which are obtained in the above step and different from each other in the focal position thereof;
obtaining a control variable of the focal position of said electron beam upon basis of plural numbers of said synthetic images, produced within the above step; and
adjusting the focal position of said electron beam upon basis of the control variable of the focal position, obtained within the above step.

16. The method for adjusting a focal position of an electron beam of an electron microscope, as described in claim 15, wherein the scan is made through irradiating said electron beam upon the same pattern on said sample, while moving the table mounting said sample thereon, upon basis of said position information of the table measured within the above step, in the step of obtaining plural numbers of scanning electron beam images, differing from each other on the focal position thereof.

17. The method for adjusting a focal position of an electron beam of an electron microscope, as described in claim 15, wherein the scan is made through irradiating said electron beam upon the same pattern on said sample, under a stand-still condition of the table mounting said sample thereon, upon basis of said position information of the table measured within the above step, in the step of obtaining plural numbers of scanning electron beam images, differing from each other on the focal position thereof.

18. The method for adjusting a focal position of an electron beam of an electron microscope, as described in claim 15, wherein the plural numbers of said synthetic images are produced through putting the plural numbers of the electron beam images, which are obtained through changing said focal position, sequentially, by a predetermined number of pieces thereof, sequentially, in said step of producing the plural numbers of synthetic pictures.

19. The method for adjusting a focal position of an electron beam of an electron microscope, as described in claim 15, wherein said focal position of the electron beam is fitted onto a surface of said sample, in said step of adjusting the focal position of said electron beam.

20. The method for adjusting a focal position of an electron beam of an electron microscope, as described in claim 15, wherein each of the plural numbers of said scanning electron images is a scanning electron image, which is obtained through one time of scanning of said electron beam upon the surface of said sample, including said predetermined pattern thereon, in the step of obtaining plural numbers of scanning electron beam images.

21. A scanning electron microscope, comprising:
a stage on which a specimen to be observed is mounted and movable;
a position sensor for sensing a position of the stage;
an electron optic system having an electron source of an electron beam, an electron lens for focusing the electron beam emitted from the electron source, a deflector for deflecting the focused electron beam to scan the surface of the specimen with the focused electron beam and a sensor for detecting charged particles emanated from the specimen mounted on the table by the irradiation of the focused and deflected electron beam; and
an image processor for processing an image of the specimen obtained by the electron optic system and outputted from the sensor;
a controller for controlling the stage, the position sensor, the electron optic system and the image processor,
wherein said controller controls the electron lens to sequentially change a focal point of the electron beam irradiating the specimen while the stage is moving and calculates a focal position which adjusts a surface of the specimen by processing the image processed by the image processor.

22. A scanning electron microscope according to claim 21, wherein said position sensor is a laser-type measuring apparatus.

23. A scanning electron microscope according to claim 21, wherein said controller further controls the deflector to irradiate and scan the electron beam on a desired area on the surface of the sample by using position information of the stage in moving detected by the position sensor.

24. A method of observing a specimen by using a scanning electron microscope, comprising the steps of:
transferring a stage on which a specimen to be observed is mounted to position an observation portion of said specimen within a viewing field of an electron microscope;
obtaining a positional information of the specimen by sensing a position of the stage while transferring the sample by the table;
repeatedly irradiating and scanning an electron beam on a predetermined area on a surface of the sample by changing focal point of the scanning electron beam; and
processing the plural images of the predetermined area to determine a focal point of the electron beam which adjust the predetermined area,
wherein in the step of repeatedly irradiating and scanning, the electron beam is controlled to scan the predetermined area by using positional information of the stage while the sample is being transferred by the table.

25. A method according to claim 24, wherein in the step of obtaining a positional information of the specimen, the position of the stage is sensed by a laser-type measuring apparatus.

26. A method according to claim 24, further comprising the steps of:
irradiating and scanning the electron beam on a surface of the sample by controlling a focal point of the electron beam to adjust the determined focal point while the sample is staying position; and
detecting charged particles emanated from the specimen by the irradiating and scanning of the fecal position controlled electron beam and forming an image of the specimen.

* * * * *